US008134847B2

(12) United States Patent
Trattler

(10) Patent No.: US 8,134,847 B2
(45) Date of Patent: Mar. 13, 2012

(54) CIRCUIT ARRANGEMENT AND METHOD FOR CONVERTING AN ALTERNATING VOLTAGE INTO A RECTIFIED VOLTAGE

(75) Inventor: Peter Trattler, Graz (AT)

(73) Assignee: Austriamicrosystems AG, Unterpremstaetten (DE)

( * ) Notice: Subject to any disclaimer, the term of this patent is extended or adjusted under 35 U.S.C. 154(b) by 675 days.

(21) Appl. No.: 11/995,881

(22) PCT Filed: Jul. 17, 2006

(86) PCT No.: PCT/EP2006/007028
§ 371 (c)(1),
(2), (4) Date: Oct. 22, 2008

(87) PCT Pub. No.: WO2007/017057
PCT Pub. Date: Feb. 15, 2007

(65) Prior Publication Data
US 2009/0103333 A1    Apr. 23, 2009

(30) Foreign Application Priority Data

Jul. 18, 2005 (DE) .......................... 10 2005 033 477

(51) Int. Cl.
*H02M 3/335* (2006.01)

(52) U.S. Cl. .................................................. 363/21.14

(58) Field of Classification Search ............. 363/17, 363/21.06, 44, 56.02, 58, 84, 132, 21.12, 363/21.13, 21.14
See application file for complete search history.

(56) References Cited

U.S. PATENT DOCUMENTS

| 6,205,035 B1 * | 3/2001 | Vollmer et al. ............. 363/17 |
| 6,459,595 B2 * | 10/2002 | Assow ..................... 363/21.14 |
| 6,501,320 B1 | 12/2002 | Le |
| 6,781,432 B2 | 8/2004 | Nishikawa |
| 2002/0141214 A1 | 10/2002 | Grover |

(Continued)

FOREIGN PATENT DOCUMENTS

DE    10328782    1/2004

(Continued)

OTHER PUBLICATIONS

International Search Report for corresponding PCT Application No. PCT/EP2006/007028, mailed May 7, 2007, 4 pages.

(Continued)

*Primary Examiner* — Adolf Berhane
*Assistant Examiner* — Nguyen Tran
(74) *Attorney, Agent, or Firm* — Fish & Richardson P.C.

(57) ABSTRACT

A circuit for converting an alternating voltage into a rectified voltage includes a first transistor having a first terminal, a second terminal, and a control terminal. The first terminal is configured to receive the alternating voltage via an input terminal, and the second terminal is electrically coupled to an output terminal for outputting the rectified voltage. A control circuit includes a first input, a second input, and a first output. The first input is electrically coupled to the first terminal of the first transistor, the second input is electrically coupled to the second terminal of the first transistor, and the first output is coupled to the control terminal of the first transistor. The control circuit is configured to generate a first control signal based on a first voltage at the first input and based on a second voltage at the second input. The conversion circuit also includes a resistive circuit.

23 Claims, 10 Drawing Sheets

U.S. PATENT DOCUMENTS

| | | | |
|---|---|---|---|
| 2004/0125621 A1* | 7/2004 | Yang et al. | 363/21.14 |
| 2005/0002207 A1* | 1/2005 | Eriksson | 363/21.04 |
| 2006/0203522 A1* | 9/2006 | Hensel | 363/21.06 |

FOREIGN PATENT DOCUMENTS

| | | |
|---|---|---|
| EP | 0 736 959 | 1/1996 |
| EP | 1 067 667 | 1/2001 |
| EP | 1 521 354 | 8/2004 |
| GB | 2395378 | 5/2004 |
| JP | 2003244946 | 8/2003 |
| WO | WO 99/52200 | 10/1999 |
| WO | WO 2005/013468 | 2/2005 |

OTHER PUBLICATIONS

Written Opinion for corresponding PCT Application No. PCT/EP2006/007028, 6 pages.

International Preliminary Report on Patentablity for corresponding PCT Application No. PCT/EP2006/007028, mailed Dec. 6, 2007, 7 pages.

"Static power convertors; static power convertor circuits; denonmination and code designation; examples", Vornorm DIN, 41 761 Beiblatt, May 1975.

English translation of the International Preliminary Examination Report for PCT/EP2006/007028.

* cited by examiner

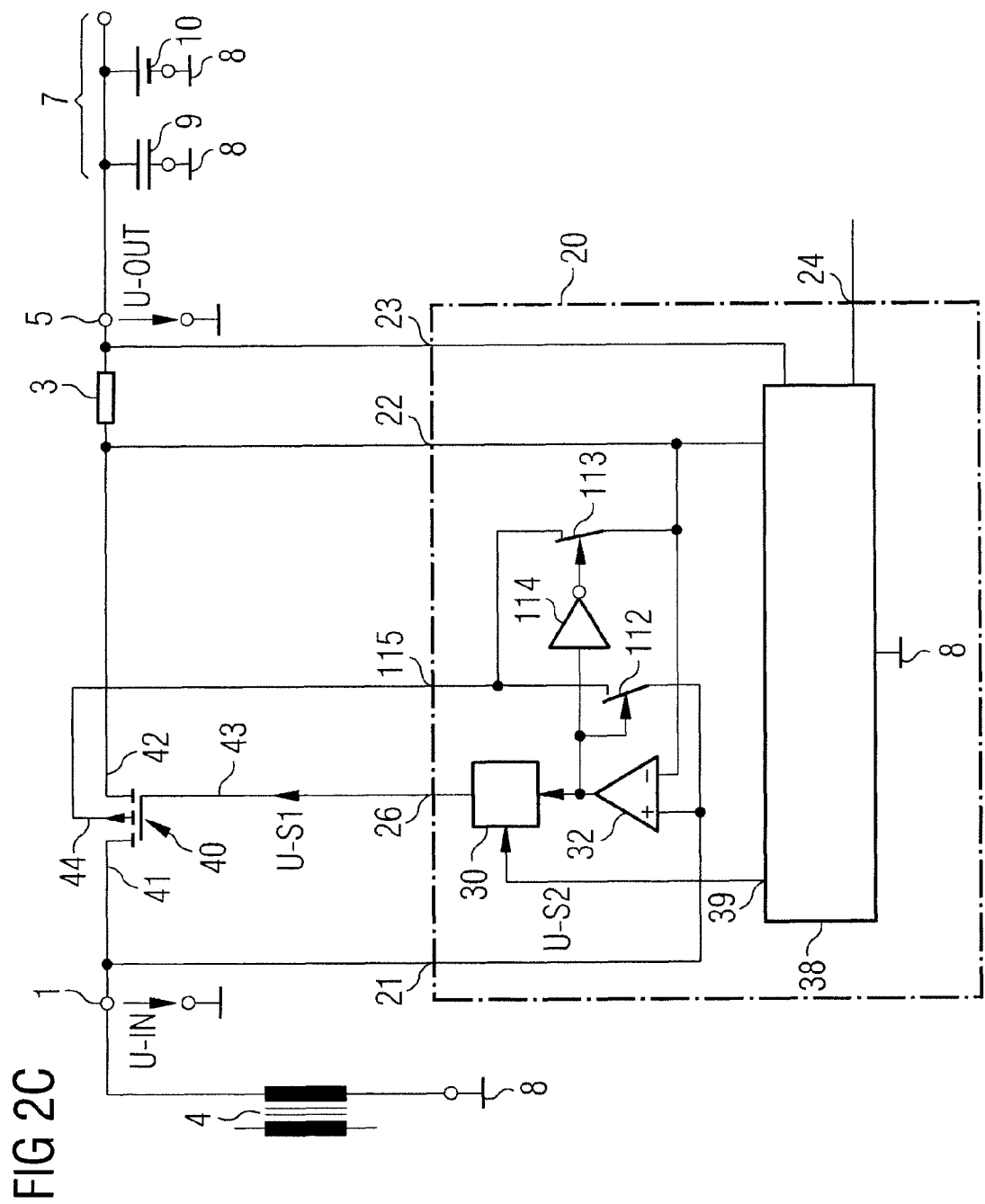

CIRCUIT ARRANGEMENT AND METHOD FOR CONVERTING AN ALTERNATING VOLTAGE INTO A RECTIFIED VOLTAGE

TECHNICAL FIELD

This application concerns a circuit arrangement for converting an alternating voltage into a rectified voltage, and also a corresponding method.

BACKGROUND

Circuit arrangements for converting an alternating voltage into a rectified voltage are frequently used in battery charging devices. Chargers of this type are provided, for instance, for charging the batteries integrated into devices used for mobile communications or digital cameras. Chargers are, furthermore, used to charge a single battery or multiple batteries.

Circuit arrangements for converting an alternating voltage into a rectified voltage are also used in mains power supply plugs. Mains power supply plugs are used for devices that can be connected to the mains electrical supply network, but which do not operate internally from a mains voltage of 230 V, but from a smaller, rectified voltage. Usual circuit arrangements for converting an alternating voltage into a rectified voltage are, typically, a half-wave rectifier or a bridge rectifier.

FIGS. 1A and 1B show typical circuit arrangements for converting an alternating voltage into a rectified voltage. Components that have the same effect or function are given the same reference codes.

FIG. 1A illustrates a typical half-wave rectifier, comprising a diode 11. At its input, the circuit arrangement is connected to a transformer 4 that serves to transform the mains voltage into what is usually a lower magnitude of alternating voltage U-IN, and/or for electrical isolation. One terminal of the diode 11 is connected to the alternating voltage U-IN. At its output, the diode 11 provides a rectified voltage U-OUT. The rectified voltage U-OUT can be passed to an electrical load 7 comprising a capacitor 9.

A current then flows through the diode 11 when the instantaneous value of the alternating voltage U-IN is greater than a threshold voltage for the diode, and the instantaneous value of the rectified voltage is U-OUT. Depending on the exact type, the threshold voltage of the diode can, for instance, be of the order of 0.3 V to 0.6 V. This means that less than a complete half-wave of the alternating voltage U-IN is used for conversion into the rectified voltage U-OUT.

FIG. 1B illustrates a typical bridge rectifier, comprising four diodes 11, 12, 13, 14. A battery 10 is coupled via a charging circuit 15 to the output terminal 5. In this circuit arrangement, segments of both half-waves of the alternating voltage U-IN are exploited to generate the rectified voltage U-OUT.

In usual circuit arrangements it is not possible to exploit the full alternating voltage U-IN to generate the rectified voltage U-OUT due to the barrier or forward threshold voltage exhibited by diodes. The rectified voltage U-OUT is, even in the absence of a load, always one diode forward-bias voltage less than the peak value of the alternating voltage U-IN.

SUMMARY

The circuit arrangement comprises the first transistor and the control circuit. The first terminal of the first transistor is connected to the input terminal of the circuit arrangement. The second terminal of the first transistor is connected to the output terminal of the circuit arrangement. The input terminal serves to introduce the alternating voltage; the rectified voltage can be accessed at the output terminal.

The first input of the control circuit is connected to the input terminal of the circuit arrangement, while its second input is connected to the second terminal of the first transistor. The first and second inputs serve to provide information about the current value of the voltage at the first and second terminals of the first transistor.

The first output of the control circuit is connected to the control terminal of the first transistor.

The control circuit is designed in such a way as to create a first control signal that depends on the value of the voltage at the first terminal and on the value of the voltage at the second terminal of the first transistor.

An advantage of this circuit arrangement is that when the first transistor is switched on, the generation of the rectified voltage does not suffer a potential drop caused by the forward-bias voltage of a diode.

Instead of an alternating voltage, it is also possible for a voltage with a different time function to be applied to the input terminal of the circuit arrangement and to be used to generate the rectified voltage. It can also be an alternating voltage with a superimposed rectified voltage. The circuit arrangement can also be used in a direct current/direct current converter, DC/DC converter for short. Alternatively, the circuit arrangement can be used for down-conversion of a DC voltage into a rectified voltage with a lower magnitude.

In a further development, the control circuit is designed to compare the instantaneous value of the voltage at the first terminal and the instantaneous value of the voltage at the second terminal of the first transistor. The control circuit is, furthermore, designed to provide the control signal in such a way that when the instantaneous value of the voltage at the first terminal is compared to the instantaneous value of the voltage at the second terminal and is found to have a higher value, the first transistor is switched into an active state, whereas in the opposite case it is switched into an inactive state. When in the active operating state, the first transistor is conductive; on the other hand, when in the inactive operating state, the first transistor acts like an open switch. It is therefore advantageously possible to supply the output with energy from the input of the circuit arrangement during the whole of the time during which the voltage at the first terminal is higher than the voltage at the second terminal of the first transistor.

In a further development, a first resistor is connected between the second terminal of the first transistor and the output terminal of the circuit arrangement. Information relating to the rectified voltage is supplied to the control circuit at its third input. The current flowing through the first resistor, or through the output terminal, can be determined from the voltage drop across the first resistor and the value of the first resistor. In one embodiment, the control circuit can compare the voltage drop between the two terminals of the first resistor with an adjustable voltage value found from the product of the limit value for the current and the value of the resistor.

In accordance with this further development, the circuit arrangement is designed to set the control signal in such a way that the current through the resistor is smaller than an upper limit value. For this purpose, the first transistor is employed as an adjustable resistor, the magnitude of whose resistance is determined by the control circuit. It is thus advantageously possible for the current supplied to an electrical load connected to the output terminal of the circuit arrangement to be held under a specified limit value at every stage of the operating cycle.

In a further development, the control circuit is designed in such a way as to compare the signal that is present at its third input with a reference voltage, and to switch the first transistor into an inactive operating state if the rectified voltage has reached or exceeded an adjustable value. This advantageously means that the rectified voltage does not exceed a limit value, and thus that the electrical load is protected from excessive voltage.

In an alternative embodiment, the control circuit is designed such that the first transistor is either driven so that it functions as a closed switch with a very low internal resistance, or is driven so that it operates like an open switch with a very high internal resistance. In this case, intermediate values of the internal resistance of the first transistor are not encountered. One advantage of this embodiment is that only very small electrical losses occur in the first transistor. On average, the desired current and/or the desired maximum voltage is obtained. In one variation, the adjustable limit value for the rectified voltage, and the adjustable limit value for the current are maintained on average over several periods of the alternating voltage.

The adjustable limit values for the current and/or the rectified voltage can be set within the control circuit. As an alternative, information regarding one or both of the adjustable limit values maybe supplied as an input signal through a fourth input to the control circuit. Alternatively, it is also possible to supply an on/off signal to the control circuit by the fourth input, in order to switch the circuit arrangement on or off.

In one further development, the control circuit comprises a first comparator, a control cell and a first cell. An instantaneous value of the alternating voltage is supplied to the input of the first comparator through the first input to the control circuit, while an instantaneous value of the voltage at the second terminal of the first transistor is supplied through the second input to the control circuit. A second control signal from the control cell and an output signal from the first comparator are supplied to the input of the first cell. At the output side, the first cell is connected to the control terminal of the first transistor through a first output of the control circuit. In this way it is advantageously possible to control, by the first comparator, the period of time during which the first transistor may be switched into a conductive state in order to increase the value of the rectified voltage.

In one embodiment, the first cell can take the form of a multiplier.

In a further development, the first cell can be implemented as a switch. The output signal from the first comparator is used to place the switch into an open or closed condition. The second signal supplied by the control cell serves to adjust the signal supplied by the first output of the control circuit precisely, and thereby to set the first transistor. If, for instance, the rectified voltage is larger than the adjustable specified value, the control cell is designed in such a way that it will supply the second control signal at its output, and this is passed to the first cell in such a way that the first transistor is placed into an inactive operating condition.

In an alternative embodiment, the control circuit is designed so as to generate the first control signal in such a way that the first transistor demonstrates slight conductance even when inactive, in order to avoid the voltage and current spikes that can arise as a result of abruptly switching on or off.

In one further development, the circuit arrangement comprises a second transistor. The first terminal of the second transistor is connected to an additional input terminal of the circuit arrangement. A second terminal of the second transistor is connected to the second terminal of the first transistor. A third control signal is provided at a second output of the control circuit, and this is supplied to a control input of the second transistor. In this way the control circuit can be advantageously designed to switch the second transistor into a conductive state when the instantaneous value of the alternating voltage at the second input terminal of the circuit arrangement is higher than the value at the second terminal of the second transistor. In this way both half-waves of the alternating input voltage can be exploited for rectification.

The control signal for the second transistor can be generated in a way that is analog to that of the control signal for the first transistor. For this purpose, the control circuit comprises a second comparator and a second cell. The input of the second comparator is connected to the first and second terminals of the second transistor. Advantageously in this way the second transistor is only switched into a closed operating condition when the alternating voltage present at its first terminal is greater than the voltage at its second terminal.

In a further development, the circuit arrangement comprises a series circuit having a third transistor and a second resistor. The series circuit can be connected in parallel with the first transistor, both at the input side and at the output side. The second resistor is used to measure the current. For this purpose, the potential of the first terminal of the second resistor, and the potential at the second terminal of that resistor can be supplied to the control circuit. The current through the second resistor can be determined from these voltages. This current is correlated to the total current that flows through the first transistor and the series circuit.

The circuit arrangement, in a further development, comprises another series circuit having a fourth transistor and a third resistor, connected at the input and at the output in parallel with the second transistor. The voltages at the first and second terminals of the third resistor are fed to the control circuit. The current through the further series circuit can be determined from the potential difference and from the resistance value of the third resistor. This current is correlated to the total current that flows through the second transistor and the further series circuit. This advantageously permits the circuit arrangement to be implemented without the first resistor. The major component of the current thereby flows from the input terminal to the output terminal through only one component, namely the first transistor in one half wave, and the second transistor in the second half wave.

In a further development, the circuit arrangement comprises a fifth and a sixth transistor. The first terminal of the fifth transistor is connected to the input terminal of the circuit arrangement. A first terminal of the sixth transistor is coupled to the additional input terminal. The second terminals of the fifth and sixth transistors are connected together. In one implementation, the second terminal of the fifth transistor and the second terminal of the sixth transistor are connected to the reference potential terminal.

In a further development, the control circuit supplies appropriate control signals for driving the fifth and sixth transistors to a control terminal of the fifth transistor and to a control terminal on the sixth transistor. For this purpose, the control circuit can supply the control signals that are fed to the control terminals of the first and second transistors either directly, or after conversion, to the control terminals of the fifth and the sixth transistors. A first and a second inverter can be used for the conversion.

In a further development, the circuit arrangement comprises a control circuit section with a third and a fourth comparator, as well as a first and a second logic gate. The control circuit section is designed to generate the control signals for the fifth and sixth transistors. The first and the second logic gates can be OR-gates in one embodiment.

In an alternative embodiment, the circuit arrangement comprises a control circuit section with a third and a fourth comparator, and a bistable flip-flop with a set input and a reset input, abbreviated to RS flip-flop.

In one embodiment the control circuit section is functionally independent of the control circuit.

The first, second, third, fourth, fifth or sixth transistors can be implemented as field-effect transistors. The field-effect transistor can be a junction field-effect transistor. In an embodiment, the field-effect transistor is implemented as a metal oxide-semiconductor field-effect transistor, abbreviated to MOSFET.

The field-effect transistor can be implemented as a power transistor.

The field-effect transistor can be implemented as an re-channel field-effect transistor. Alternatively, the field-effect transistor can be implemented as a p-channel field-effect transistor.

In one embodiment the first and the second transistors are implemented as p-channel field-effect transistors, while the fifth and sixth transistors are implemented as n-channel field-effect transistors.

In an embodiment, the third and fourth transistors are also p-channel field-effect transistors, assuming that the first and second transistors are p-channel field-effect transistors. The first, second, third and fourth transistors may be located on the same semiconductor body.

The substrate terminal of field-effect transistors is connected to a specified potential.

The chosen types of field-effect transistors are driven in the familiar manner. Suitable control voltages for the control terminals, and voltages for the substrate terminals or for connections of the substrate terminals to other terminals, are provided.

A substrate terminal of the n-channel field-effect transistor can be connected to the reference potential terminal. A bulk terminal for the p-channel field-effect transistor can be coupled to the output terminal.

A circuit can be provided for the bulk terminal of the p-channel field-effect transistor that connects the first terminal of the p-channel field-effect transistor to the bulk terminal if the voltage at the first terminal is higher than the voltage at the second terminal of the transistor, but which, in the other case, connects the second terminal to the bulk terminal. Similarly, a circuit can be provided for the substrate terminal of the n-channel field-effect transistor that connects the first terminal of the n-channel field-effect transistor to the substrate terminal if the voltage at the first terminal is smaller than the voltage at the second terminal of the transistor, but which, in the other case, connects the second terminal to the substrate terminal. In one embodiment this connection can comprise a semiconductor switch.

The control circuit and the transistors can be implemented on different semiconductor bodies. In this way it is advantageously possible to use special technologies to implement the components that carry high currents.

Alternatively, the circuit arrangement can be integrated onto one semiconductor body. One advantage of integrating the active components and the control circuit on a single semiconductor body is that lead lengths are shortened, and the number of contacts that must be made, along with the expense of making those contacts, can be kept low.

An electrical load can be suitably for connection to the output terminal. The electrical load can have a capacitor that serves to smooth the rectified voltage and to store energy. The electrical load can have a chargeable battery.

The secondary terminal of a transformer can be suitably for connection to the input terminals of the circuit arrangement. In another embodiment, the input terminal of the circuit arrangement can be connected to a receiving coil for the supply of energy, and the circuit arrangement can be part of a wireless charging architecture.

In one embodiment, a rectifier having at least one diode is connected to the input terminal in order to supply power to the control circuit and, if present, to the control circuit section. An auxiliary voltage is generated by this rectifier, with which the control circuit can, for instance, be made to start up or switch on.

The method thus comprises the following steps: the instantaneous value of the voltage at the first terminal of the first transistor is compared to the instantaneous value of the voltage at the second terminal of the first transistor. The alternating voltage is presented to the first terminal of the first transistor. The second terminal of the transistor is connected to the output terminal. The rectified voltage is made available at the output terminal.

The first control signal for driving the first transistor is generated in such a way that the first transistor is switched into an active operating state if the instantaneous value of the voltage at the first terminal is higher than the instantaneous value of the voltage at the second terminal.

In the event that the instantaneous value of the voltage at the first terminal is smaller than the instantaneous value of the voltage at the second terminal, the first transistor is switched into an inactive operating state by the first control signal. In this way, the first transistor is advantageously only switched into a conductive state when, as a result of the voltage relationships, energy can flow from the input to the output of a circuit arrangement.

In one embodiment, the instantaneous value of the rectified voltage is also compared with a preset value for the rectified voltage. The first control signal for driving the first transistor is then only placed into the state that will switch the first transistor into an active operating state if the instantaneous value of the rectified voltage is smaller than the preset value for the rectified voltage. The flow of energy is advantageously halted if the rectified voltage has reached or exceeds the specified value.

In a further development, the first control signal is generated in such a way that a current that flows through the first transistor is smaller than or equal to a specified value. In this way, a current through the load is advantageously limited.

In a further development, it is arranged that switching the first transistor into an inactive operating state only occurs at times when the voltage difference between its first and second connections passes through zero. Excessive voltage peaks are avoided in this way, as the first transistor is not conducting at that moment.

In another further development, the first transistor is only switched into an active operating state or into an inactive operating state when a voltage across a controlled channel in the first transistor is very small compared with the amplitude of the alternating voltage.

As an alternative to an alternating voltage, a voltage with a different waveform can be converted into a rectified voltage. It is also possible to convert an alternating voltage with a superimposed DC voltage. The method can also be used for DC/DC conversion where one voltage is converted into a lower voltage.

We refer here to the dependent claims in respect of other further developments of the method.

In summary, the proposed principle offers the following advantages:

- Active components are used instead of diodes, the active components being implemented on one semiconductor circuit.
- Whereas diodes exhibit a barrier or "knee" voltage, the voltage across the transistor when used according to the proposed principle is determined entirely by the resistance of the controlled channel between the first and second terminals.
- The current between the input to the circuit arrangement and the output from the circuit arrangement flows to the output terminal without the voltage drop found in a diode.
- The proposed principle also permits a voltage with a waveform other than sinusoidal to be converted into a rectified voltage. The proposed principle can therefore also be used as a DC/DC converter for down-conversion.
- Because the active components are controlled, the same components can be used to limit the magnitude of the rectified voltage and/or the current flowing through the output terminal.

Embodiments are explained in more detail below with the aid of several figures. Components having the same function or effect are given the same reference codes. Inasmuch as the components and functions of parts of the circuits are identical, their description is not repeated in each of the following figures.

DESCRIPTION OF THE DRAWINGS

FIGS. 2A to 2C show circuit arrangements according to the proposed principle.

DETAILED DESCRIPTION

Figure 1A:
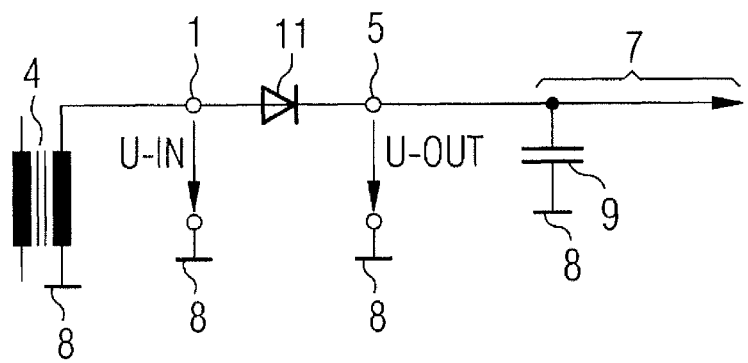
FIGS. 1A and 1B show a conventional circuit arrangement.
Figure 1B:
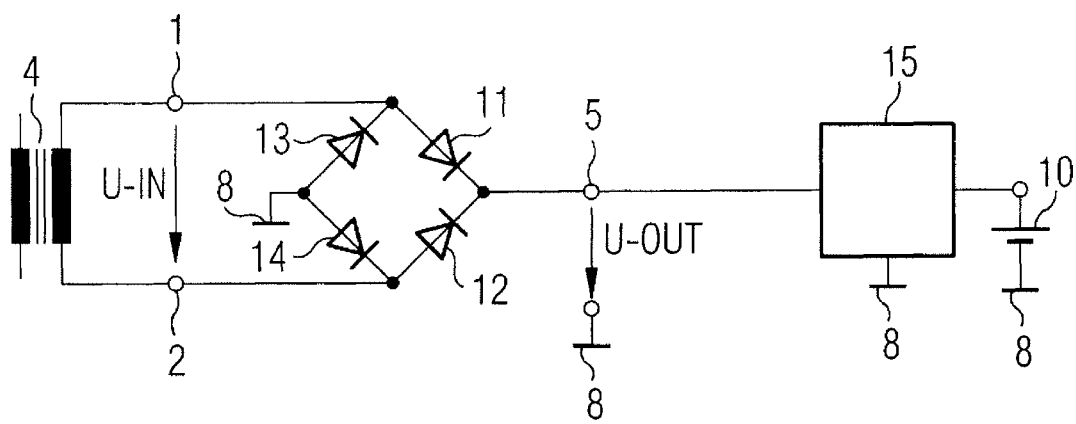

FIGS. 1A to 1B show conventional circuit arrangements for converting an alternating voltage into a rectified voltage. Because FIGS. 1A to 1B have already been described in the introduction to the description, a repeated description of these figures is omitted here.

Figure 2A:
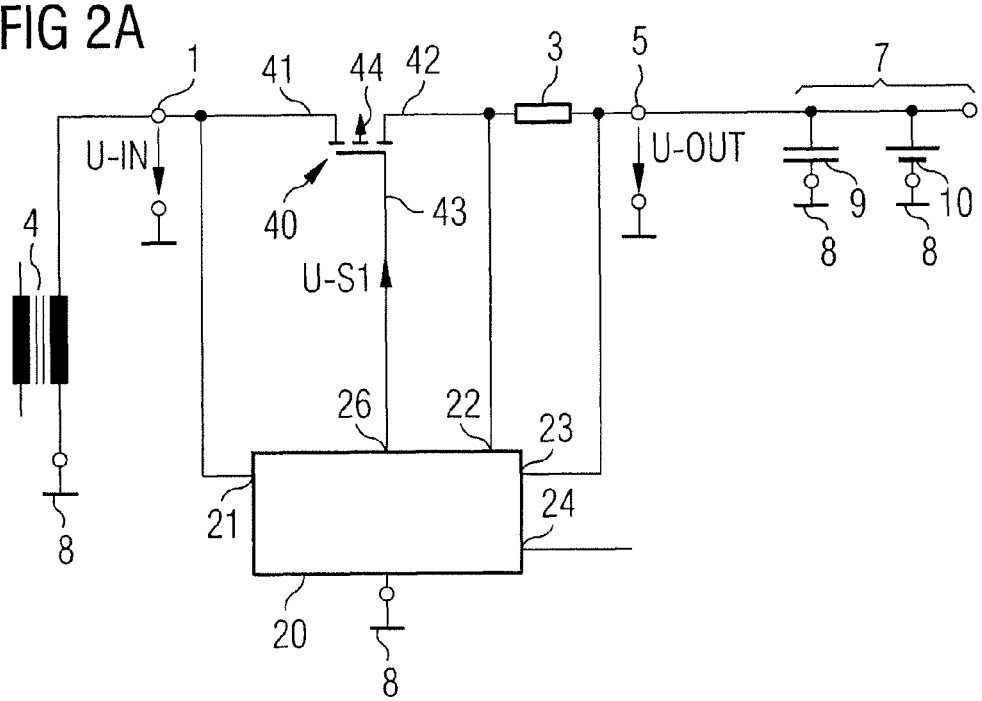

FIG. 2A shows an example of a circuit arrangement for converting an alternating voltage U-IN into a rectified voltage U-OUT. The circuit arrangement comprises a first transistor 40, whose first terminal 41 is connected to the input terminal 1 of the circuit arrangement. The second terminal 42 of the first transistor 40 is coupled to the output terminal 5 of the circuit arrangement. Voltages at the first and second terminals 41, 42 of the first transistor 40 are supplied to the first and second inputs 21, 22 of a control circuit 20. A controlling signal can be supplied to a fourth input 24 of the control circuit. This controlling signal can, for instance, represent a specified value for the rectified voltage U-OUT, or an upper limit for the current flowing through the output terminal 5. The control circuit 20 is designed to provide a control signal U-S1 from its first output 26 to a control terminal 43 of the first transistor 40.

An electrical load 7 connected to the output terminal 5 comprises, in the embodiment shown, of a capacitor 9 or a rechargeable battery 10. A secondary terminal of a transformer 4 is connected, in the shown embodiment, to the input terminal 1 of the circuit arrangement. The control circuit 20 is designed only to switch the first transistor 40 into a conductive state by the control signal U-S1 if the voltage at the first terminal 41 of the first transistor 40 is greater than the voltage at the second terminal 42 of that transistor.

In a further development, a first resistor 3 is connected between the second terminal 42 of the first transistor 40 and the output terminal 5. The output terminal 5 is connected to a third input 23 of the control circuit 20. In this further development it is therefore advantageously possible to determine the current through the first transistor 40 with the aid of the first resistor 3. The first control signal U-S1 can be adjusted on the basis of this information in such a way that the current through the first resistor 3 does not exceed an adjustable limit value.

The circuit arrangement in accordance with FIG. 2A is thus able to generate a rectified voltage U-OUT from an alternating voltage U-IN without the necessity for the value of the rectified voltage U-OUT to be smaller than the peak value of the alternating voltage U-IN by the magnitude of the forward bias voltage of a diode.

It is thus advantageously possible to limit the rectified voltage U-OUT and/or the current flowing through the output 5 without inserting any further components in the path of the power flow.

Figure 2B:
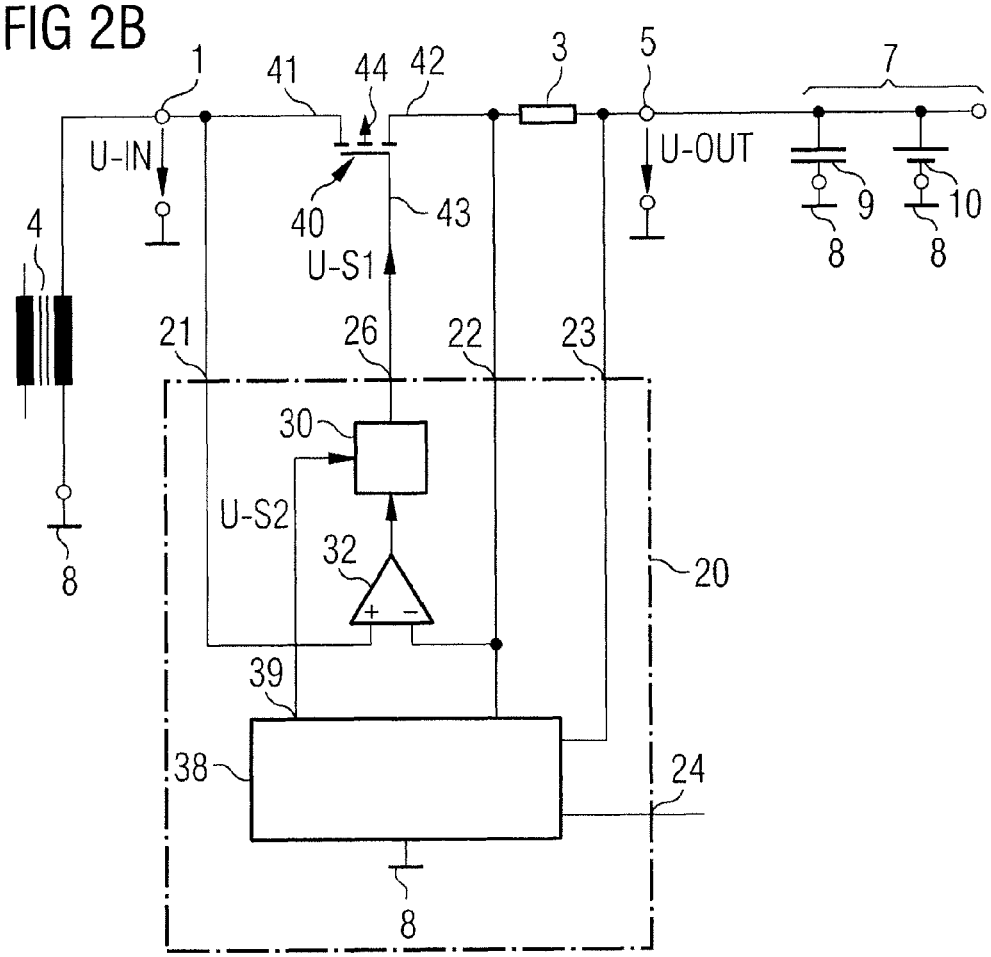

As a further development of the circuit arrangement according to FIG. 2A, FIG. 2B shows further detail of the control circuit 20. The control circuit 20 comprises a first comparator 32, a first cell 30, and a control cell 38. By the first comparator 32, the voltage at the first terminal 41 of the first transistor 40 is compared with the voltage at the second terminal 42 of the first transistor 40. An output signal from the first comparator 32 is supplied to an input of the first cell 30.

The control cell 38 is designed to provide a second control signal U-S2 at its output 39; this signal is fed to a second input of the first cell 30. The first cell 30 can be formed as a switch controlled by the output of the first comparator 32, and which passes the second control signal U-S2 present at the output 39 of the control cell 38 to the first output 26 of the circuit arrangement 20. In this way, depending on the voltages at the first or second terminals 41, 42 of the first transistor 40, the second control signal U-S2 can be switched through to the first transistor 40 in order to place it in an active operating state, or not switched through, in order to place it in an inactive operating state. When in the inactive operating state, the controlled channel between the first and second connections 41, 42 of the first transistor 40 exhibits little or no conductance. When in the active operating state, the first transistor 40 is switched in a conductive state.

In a further development, not illustrated, the first cell 30 can comprise an impedance that connects the output of the first cell 30 to an adjustable voltage. As a result, the control terminal 43 of the first transistor is not allowed to float when the switch in the first cell 30 is open, but is pulled to a defined potential. This means that when the first transistor 40 is in the inactive operating state, it acts as an open switch rather than being in an undefined state.

In another embodiment, not illustrated, the control cell 38 can be designed to provide an additional control signal at a further output, supplied to a third input of the first cell 30. The first cell 30 can comprise a changeover switch, whose position depends on the output from the first comparator 32, and which switches between the two control signals. In this way it is advantageously possible to supply two different non-zero voltages to the first transistor 40 as the first control signal U-S1, wherein one of the two voltages serves to put the first transistor 40 into an active operating state, and a further voltage serves to place the first transistor 40 into an inactive operating state.

The control cell 38 is designed to determine a potential drop across the first resistor 3. The current flowing through the first transistor 40 can be determined from this voltage drop divided by the value of the first resistor 3. The control cell 38 is designed to output the second control voltage U-S2 at its output 39 at such a level that through the setting of the first transistor 40, an upper limit for the current that flows through the output terminal 5, and thereby also through transistor 40, is not exceeded. In this way the on-state resistance of the first transistor 40 is controlled. An advantage of monitoring the current is that the battery that is to be charged, or any other electrical load, is protected from excessive current, the effects of a short-circuit in the electrical load are limited, and the first transistor 40 is protected from current overload.

FIG. 2C shows an example of a further development of FIG. 2B.

In FIG. 2C the first transistor 40 takes the form of a field-effect transistor. A bulk terminal 44 to the first transistor 40 is coupled to the first terminal 41 of the first transistor 40, or to the second terminal 42 of the first transistor 40, depending on the voltage at the first terminal 41 and on the voltage at the second terminal 42.

The bulk terminal 44 of the first transistor 40 is connected according to FIG. 2C to a sixth output 115 of the control circuit 20. The sixth output 115 is coupled by a first switch 112 to the first input 21 of the control circuit 20, and thereby to the first terminal 41 of the first transistor 40, and by a second switch 113 to the second input 22 of the control circuit 20, and thereby with the second terminal 42 of the first transistor 40. Which of the two switches, 112 or 113, is closed can be controlled by a further comparator, not illustrated, to which the voltages at the first and second terminals 41, 42 of the first transistor 40 are supplied.

The control signals for the two switches 112, 113 can advantageously be obtained from the signal at the output of the first comparator 32.

If the first transistor 40 is implemented, as shown in FIG. 2C, as a p-channel field-effect transistor, then a positive signal at the output of the first comparator 32 will close the first switch 112, whereas a negative signal, or a logical 0 signal, will open the first switch 112. An inverter 114 is arranged between the output of the first comparator 32 and a control input to the second switch 113, so that in the case of a positive signal at the output of the first comparator 32, the second switch 112 is opened, while a negative signal, or a logical 0 signal will close the second switch 112.

It is therefore advantageous for the bulk terminal 44 of the first transistor 40, realized as a p-channel field-effect transistor, to be connected to the first terminal 41 if this has a higher potential than the second terminal 42, but in the other case for it to be connected to the second terminal 42. The bulk terminal 44 of the first transistor 40 is thus supplied with the higher potential from the two potentials at the first and second terminals 41, 42 of the first transistor 40. The diodes from the bulk terminal to the first terminal 41, and from the bulk terminal to the second terminal 42 in the p-channel field-effect transistor are thus advantageously reverse-biased.

Figure 3A:
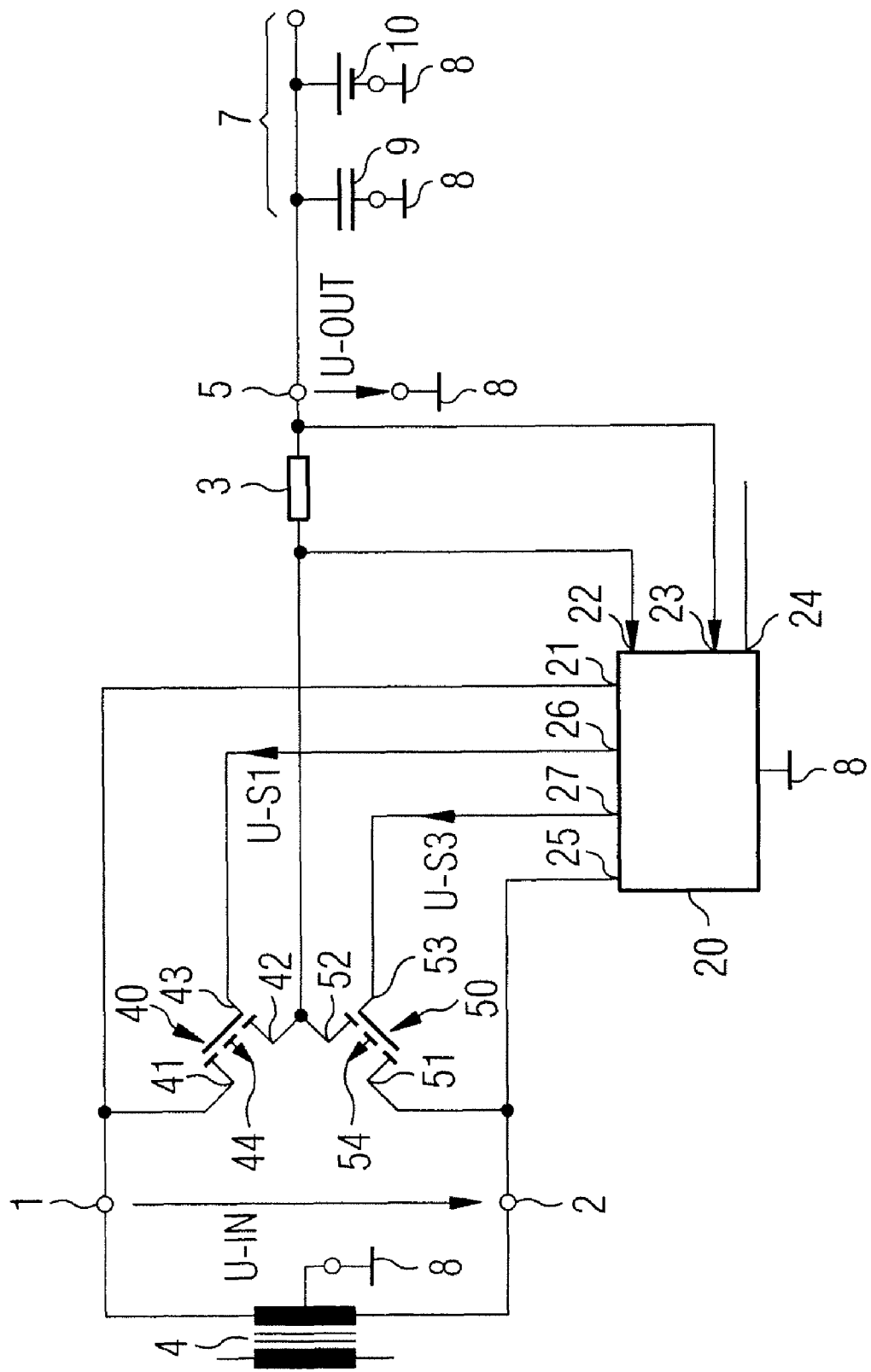
FIGS. 3A to 3D show further developments of the circuit arrangements of FIGS. 2A and 2B in accordance with the proposed principle.

FIG. 3A shows an example of a further development of the circuit arrangement according to FIG. 2A, and shows in addition a second transistor 50, whose first terminal 51 is connected to a second input terminal 2, and whose second terminal 52 is connected to the second terminal 42 of the first transistor 40. The second terminal 42 of the first transistor 40 is connected via the first resistor 3 to the output terminal 5 of the circuit arrangement.

A bulk terminal 54 for the second transistor 50 is driven like the bulk terminal 44 of the first transistor 40. For this purpose, a circuit as shown in FIG. 2C can be used in one embodiment.

The control circuit 20 is designed to provide a third control signal U-S3 at its second output 27 which is supplied to the control terminal 53 of the second transistor 50. The fifth input 25 to the control circuit 20 is supplied with the voltage present at the additional input terminal 2, which is also present at the first terminal 51 of the second transistor 50. It is thus arranged that the third control signal U-S3 only switches the second transistor 50 into a conductive state when the voltage at the first terminal 51 is higher than the voltage at the second terminal 52 of the second transistor 50. In the opposite case, the third control signal U-S3 is arranged to switch the second transistor 50 into an inactive operating state. This advantageously permits the alternating voltage U-IN to be exploited more effectively than can be done with the circuit arrangement of FIG. 2A.

Figure 3B:
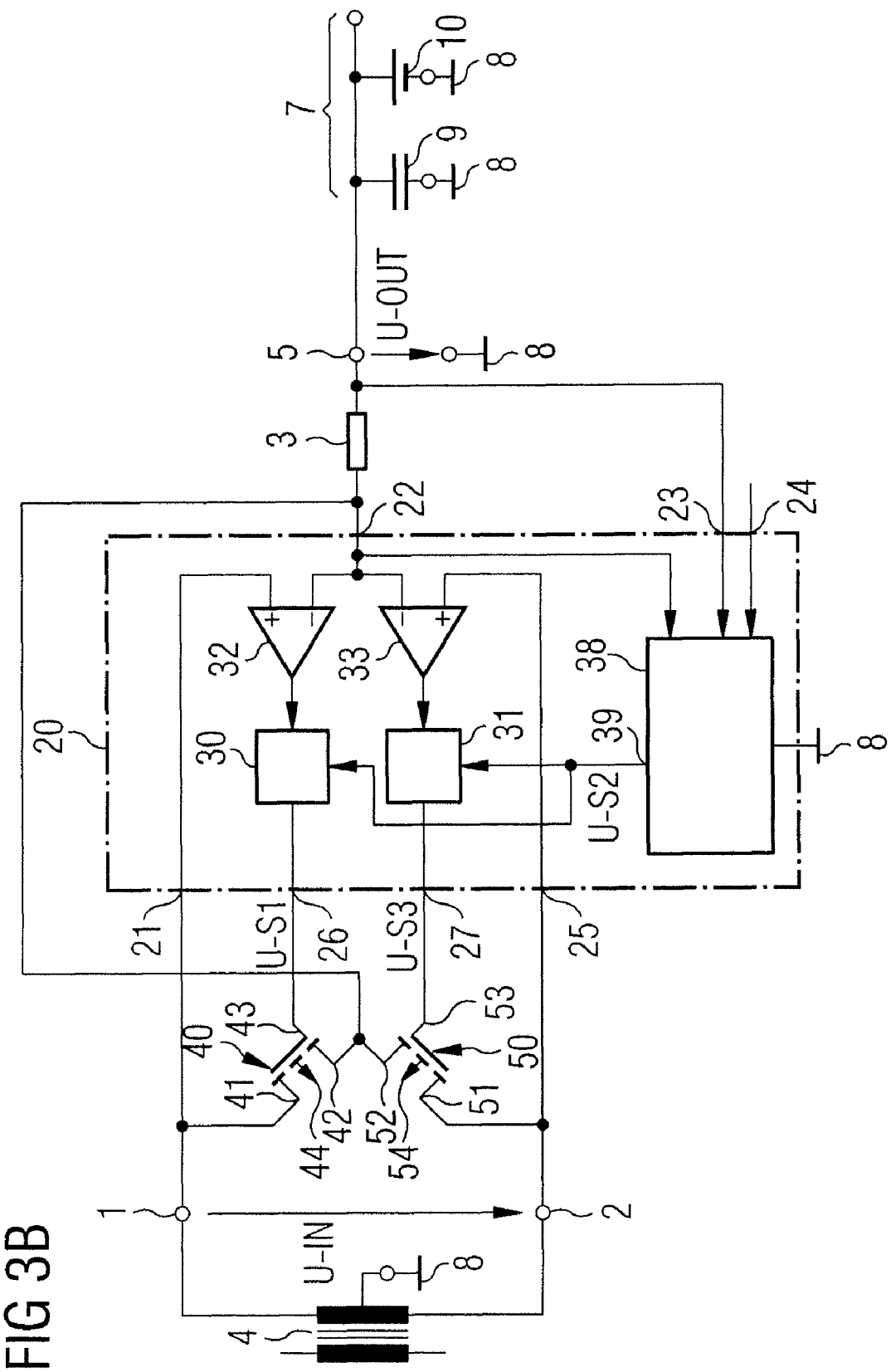

FIG. 3B shows a further development of the circuit arrangement according to FIG. 3A. Details of the control circuit 20 are shown in FIG. 3B. The control circuit 20 is shown on FIG. 3B analogously to the control circuit in FIG. 2B.

The voltages at the first and second terminals 41, 42, 51, 52 of the first and second transistors 40, 50 are applied to the inputs of the first comparator 32 and of a second comparator 33 respectively. The signal at the output of the first comparator 32 and at an output of the second comparator 33 respectively serve to control a switch or a changeover switch in the first cell 30 and in a second cell 31. In this way, the first and second transistors 40, 50 are advantageously only switched into a conductive state when it is possible for energy to flow from input terminal 1 or 2 to the output terminal 5 of the circuit arrangement.

The signal at the output of the first comparator 32 can be used to set a voltage at the bulk terminal 44 of the first transistor 40, while correspondingly the signal at the output of the second comparator 33 is used to set a voltage at the bulk terminal 54 of the second transistor 50 in a further development that is not illustrated.

The output 39 of the control cell 38 provides the second control signal U-S2 in parallel to the first and second cells 30, 31. The control signal U-S2 is generated in such a way that the current through the resistor 3 is smaller than or equal to a specified limit for the current. The on-state resistance of the first transistor 40 and of the second transistor 50 is advantageously controlled by the level of the voltage at the control terminals 43, 53 of the first and second transistors 40, 50. This on-state resistance serves to limit the current through the first and second transistors 40, 50, and to limit the voltage that is presented to the connected electrical load 7.

Figure 3C:
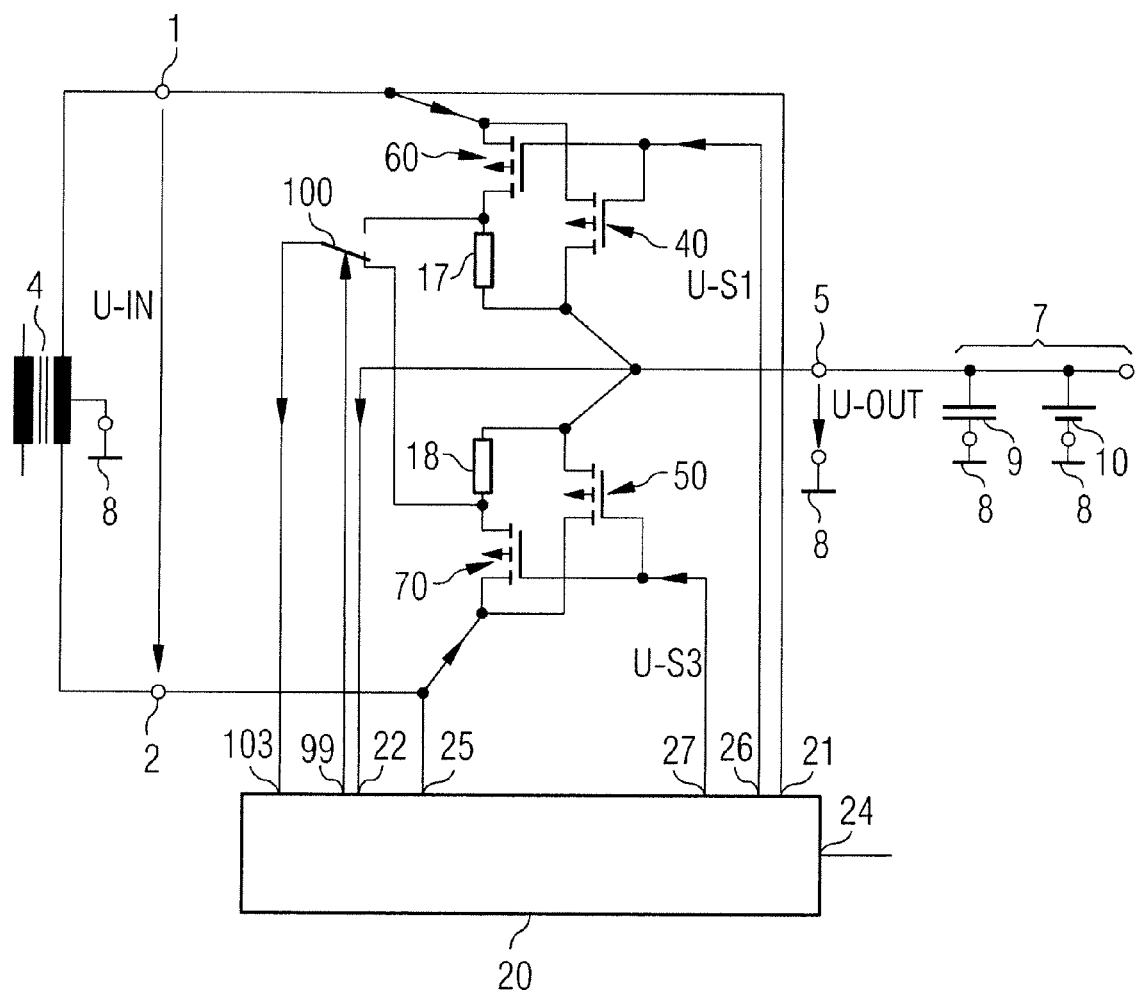

FIG. 3C shows a further development of the circuit arrangement according to FIG. 3A in line with the proposed principle.

In the circuit arrangement according to FIG. 3C, a series circuit which comprises a third transistor 60 and a second resistor 17 is connected in parallel with the first transistor 40. Similarly, a series circuit comprising a fourth transistor 70 and a third resistor 18 is connected in parallel with the second transistor 50.

The first control signal U-S1 is applied to the control inputs of the first transistor 40 and of the third transistor 60. Similarly, the third control signal U-S3 is applied to the control terminals of the second and fourth transistors 50, 70.

Voltage taps at the second resistor 17 and at the third resistor 18 serve to determine the voltage drop across the second resistor 17 and across the third resistor 18. For this purpose, a changeover switch 100 is provided in the embodiment illustrated, which switches between a terminal of the second resistor 17 and a terminal of the third resistor 18, so that a voltage at one of the two terminals is supplied to a seventh input 103 of the control circuit 20. The changeover switch 100 is controlled by the signal provided at the fifth output 99 of the control circuit 20. The additional voltage required in order to determine a voltage difference across the second or third resistor 17, 18 is supplied to the control circuit 20 through its second input 22.

The voltage values, and the resistance values of the second and third resistors 17, 18 permit the current flowing through the parallel circuit from the first transistor 40 or through the third transistor 60 and the second resistor 17 to be known, and the first control voltage U-S1 set in such a way that the current flowing through the output terminal 5 is smaller than the adjustable limit value. In a similar way it is also possible to know the current flowing through the parallel circuit formed by the second transistor 50 and the series circuit having the fourth transistor 70 and the third resistor 18.

In the circuit arrangement according to FIG. 3C, the first resistor 3 of FIG. 3B is not required. This advantageously means that the major proportion of the current flows from the input terminal 1 to the output terminal 5 in one half wave of the alternating voltage U-IN through only one component, the first transistor 40, and through the second transistor 50 in the subsequent half wave. This process repeats cyclically. This advantageously avoids energy losses through ohmic dissipation in the principal current branch, or in the first resistor 3.

Figure 3D:
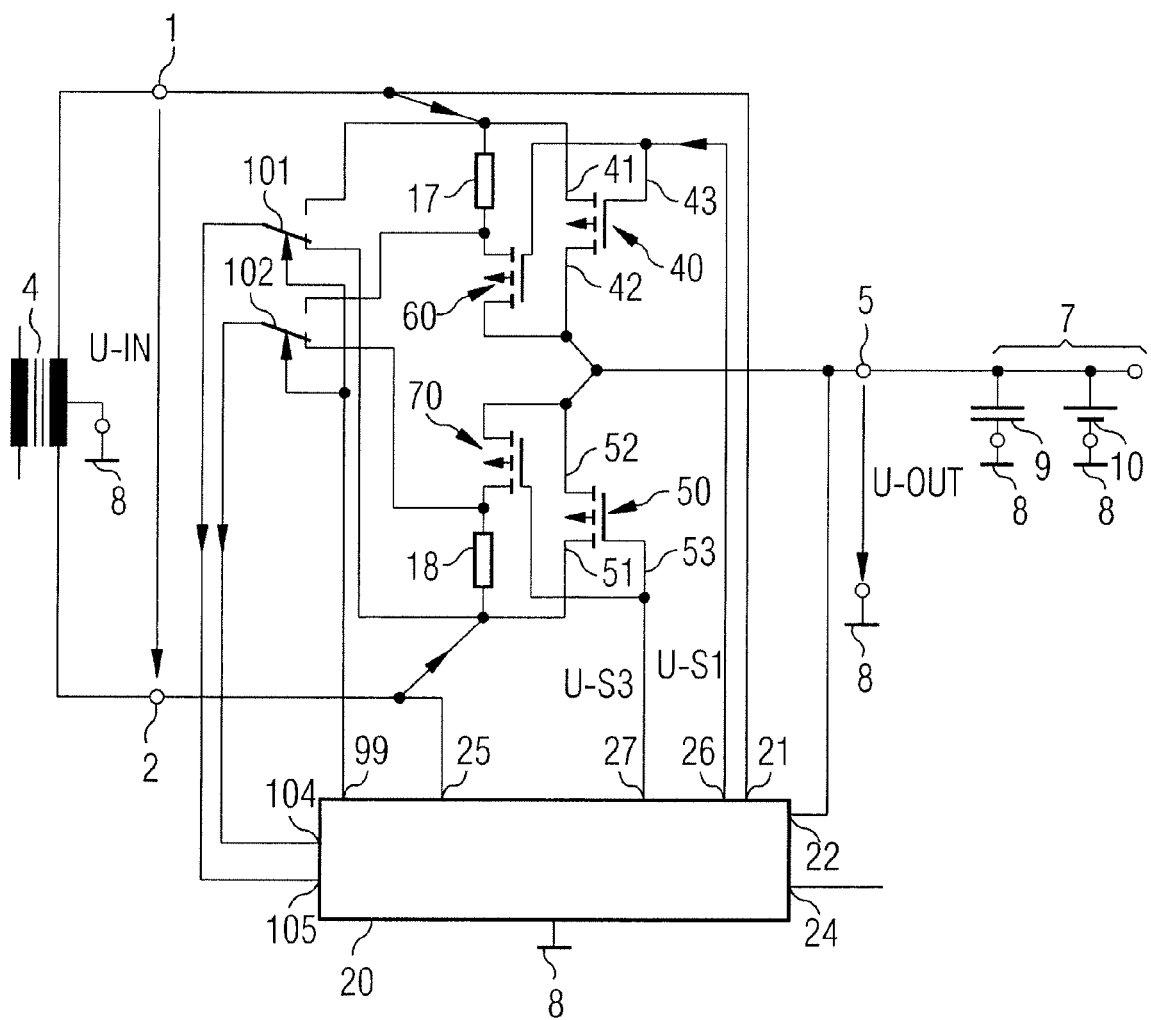

FIG. 3D shows another embodiment of the circuit arrangement according to FIG. 3A or 3C.

In FIG. 3D the series circuit comprising the second resistor 17 and the third transistor 60 is connected in parallel with the first transistor 40 the other way round. Whereas in the circuit arrangement according to FIG. 3C one of the terminals of the second resistor 17 is connected to the output terminal 5 of the circuit arrangement, in FIG. 3D one terminal of the second resistor 17 is connected to the input terminal 1 of the circuit arrangement.

A voltage drop across the second resistor 17 or across the third resistor 18 is supplied to the control circuit 20.

In the example embodiment illustrated in FIG. 3D, the voltage drops across the second resistor 17 and across the third resistor 18 are applied to the control circuit 20 through a changeover switch 101 and a further changeover switch 102. For this purpose, the control circuit 20 provides a control signal for setting the changeover switch 101 and the further changeover switch 102 at its fifth output 99.

The further developments illustrated in FIGS. 3C and 3D can be applied to FIGS. 2A to 2C, in order to replace the resistor 3. For this purpose, as in FIGS. 3C and 3D, the third resistor 60, in series with the second resistor 17, is to be connected in parallel with the first transistor 40 in FIGS. 2A to 2C.

Figure 4A:
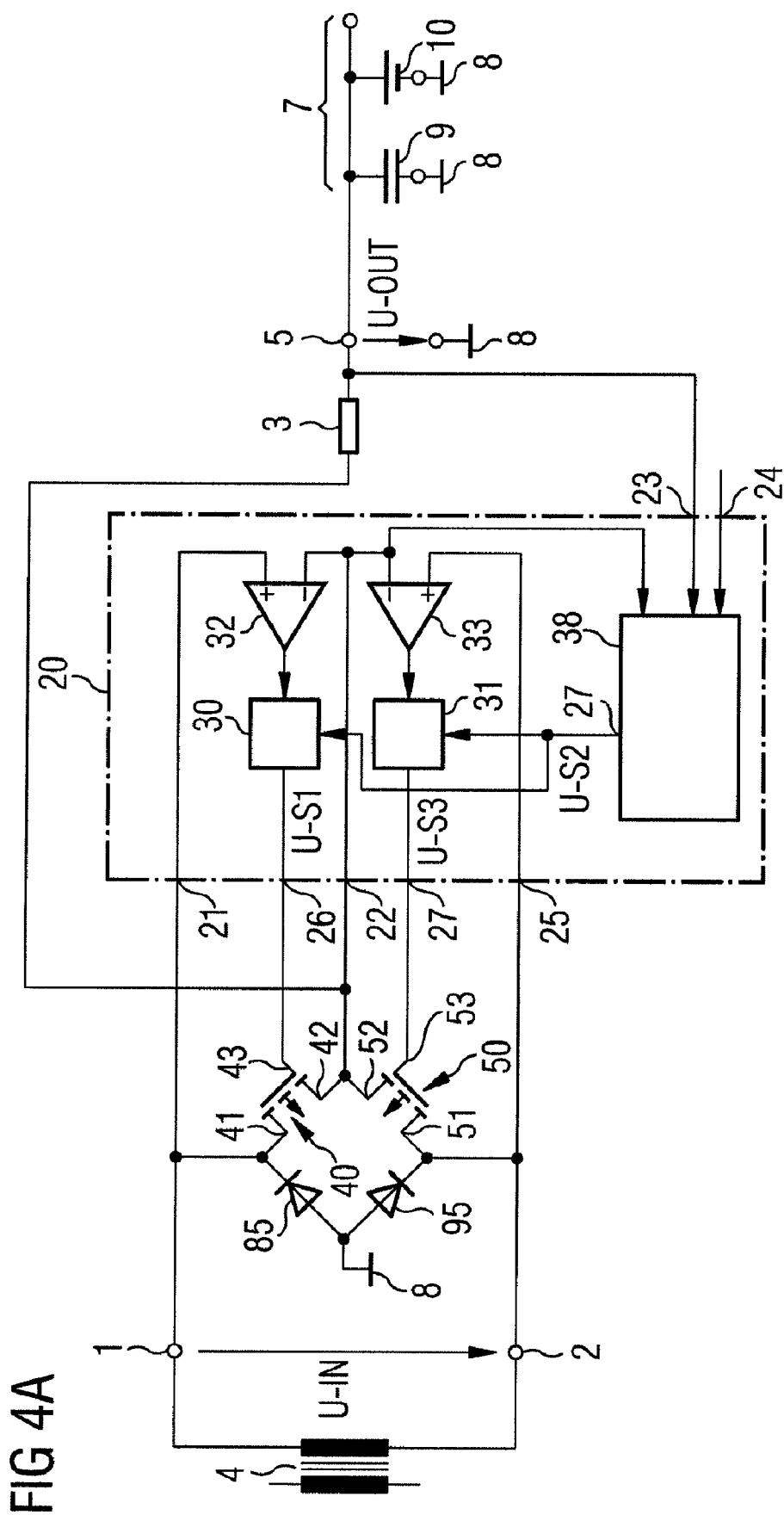
FIGS. 4A and 4B show examples of further developments of the circuit arrangement according to FIG. 3B in accordance with the proposed principle.

FIG. 4A shows an example of the further development of the circuit arrangement according to FIG. 3B.

A series circuit having a first and a second diode 85, 95 is connected between the two input terminals 1, 2. The cathode of the first diode 85 is here connected to the first terminal 41 of the first transistor 40, and the anode of the first diode 85 is connected to the reference potential terminal 8. The anode of the second diode 95 is also connected to the reference potential terminal 8; the cathode of the second diode 95 is connected to the first terminal 51 of the second transistor 50. In a pn diode, the cathode is the n-doped semiconductor region, while the anode is the p-doped semiconductor region.

If the voltage between the first terminal 41 of the first transistor 40 and the reference potential terminal 8 is negative, current will flow through the first diode 85; if this voltage is positive, no current flows.

If the voltage between the first terminal 51 of the second transistor 50 and the reference potential terminal 8 is negative, current flows through the second diode 95; if this voltage is positive, no current flows.

This advantageously leads to a lower proportion of ripple in the rectified voltage U-OUT as compared with the proportion of ripple from the arrangements of FIGS. 2A to 2C.

The circuit sections from FIGS. 3A, 3C and 3D can also be combined with the series connection of the first and second diodes 85, 95.

Figure 4B:
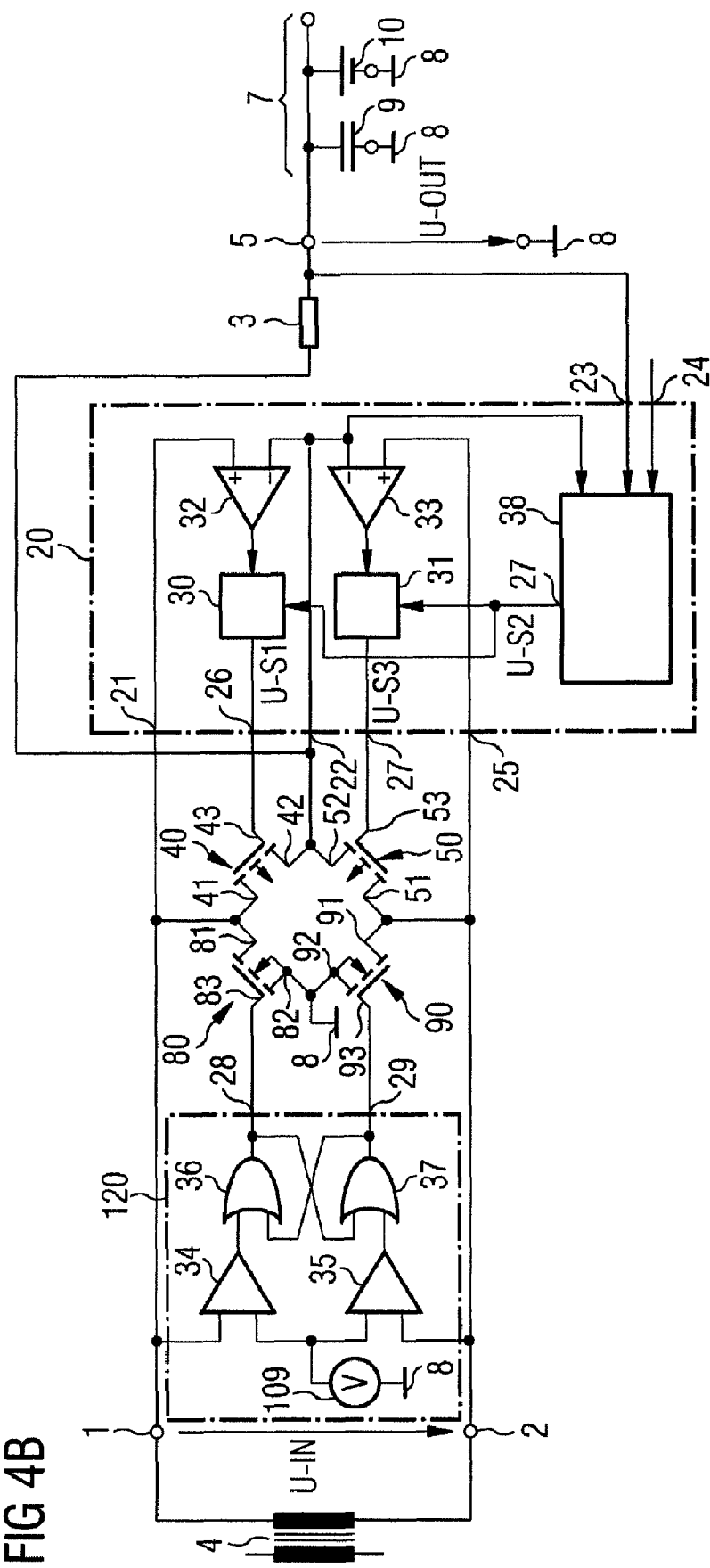

FIG. 4B shows a further example of the further development of the circuit arrangement according to FIG. 3B.

In addition, the circuit arrangement according to FIG. 4B comprises a fifth and a sixth transistor 80, 90. The first terminal 81 of the fifth transistor 80 is connected to the input terminal 1 of the circuit arrangement. The first terminal 91 of the sixth transistor 90 is coupled to the further input terminal 2 of the circuit arrangement. A second terminal 82 of the fifth transistor 80 is connected to a second terminal 92 of the sixth transistor 90. The second terminal 82 of the fifth transistor 80 is coupled, in the shown embodiment, to a reference potential connection 8.

The control signals at a control input 83 to the fifth transistor 80 and at a control input 93 of the sixth transistor 90 are created in the circuit arrangement according to FIG. 4 by a third and a fourth comparator 34, 35, and of a first and the second digital gate 36, 37. For this purpose, the input of the third comparator 34 is coupled to the input terminal 1 and to a voltage source 109. Correspondingly, the input of the fourth comparator 35 is connected to the further input terminal 2 of the circuit arrangement and to the voltage source 109. The outputs of the first and fourth comparators 34, 35 are connected via the logic gates 36, 37 to the control terminal 83 of the fifth transistor 80 and the control terminal 93 of the sixth transistor 90.

The first and second logic gates 36, 37 can, in accordance with the embodiment illustrated in FIG. 4, be implemented as a first and a second OR gate 36, 37, creating an RS flip-flop. Here, one output of the first comparator 34 is connected to an input of the first OR gate 36. An output of the first OR gate 36 is connected to the control terminal 83 of the fifth transistor 80 and with one input of the second OR-gate 37. The output of the second comparator 35 is coupled to another input of the second OR gate 37. An output from the second OR-gate 37 is coupled to the control terminal 93 of the sixth transistor 90 and to a further input of the first OR gate 36.

Instead of the two OR gates 36, 37 it is also possible to arrange an RS flip-flop comprising NOR gates, or comprising individual transistors instead of complete gates, between the two comparators 34, 35 and the two control terminals 83, 93.

In this way it is advantageously possible to convert an alternating voltage U-IN into a rectified voltage U-OUT. This is implemented through a circuit arrangement that uses parts of both the positive and the negative half-waves of the alternating voltage U-IN in order to generate the rectified voltage U-OUT.

The circuit arrangement is thus designed to convert the alternating voltage, or a voltage with a different waveform present at its input terminal, efficiently.

Figure 5:
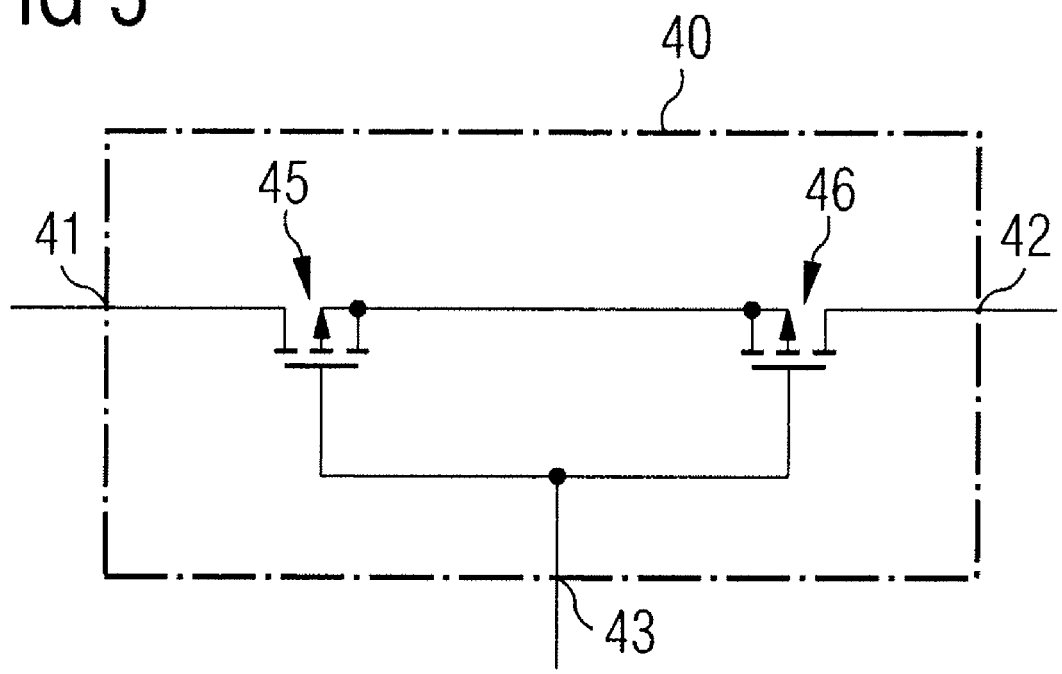
FIG. 5 shows an example of a further development for a first transistor that can be employed in FIGS. 2A, 2B and 3A to 4B.

FIG. 5 illustrates an example of a further development for a first transistor 40 that can be employed in FIGS. 2A, 2B and 3A to 4. The second to sixth transistors 50, 60, 70, 80, 90 in FIGS. 3A to 4B can also be further developed correspondingly.

In the further development, a seventh and an eighth transistor, 45, 46 connected in series are used in place of the first transistor 40. The control terminals of both transistors 45, 46 are connected together, and are given the same signal. Together, therefore, they represent the control terminal 43 to the first transistor. One terminal of the seventh transistor 45 forms the first terminal of the first transistor 40. A terminal of the eighth transistor 45 forms the second terminal of the first transistor 40.

A bulk terminal and a further terminal of the seventh transistor 45 are connected to the bulk terminal and to a further terminal of the eighth transistor 46.

In this way, the voltages between the bulk terminals of the two transistors 45, 46 and the other terminals are reduced, and the risk that a source-bulk diode or a drain-bulk diode becomes conductive is lowered.

What is claimed is:

1. A circuit for converting an alternating voltage into a rectified voltage, comprising:
   a first transistor comprising a first terminal, a second terminal, and a control terminal, the first terminal being configured to receive the alternating voltage via an input terminal, the second terminal being electrically coupled to an output terminal for outputting the rectified voltage; and
   a control circuit comprising a first input, a second input, and a first output, the first input being electrically coupled to the first terminal of the first transistor, the second input being electrically coupled to the second terminal of the first transistor, and the first output being electrically coupled to the control terminal of the first transistor, the first output for providing a first control signal to the first transistor;
   a resistive circuit between the second terminal of the first transistor and the output terminal, the control circuit comprising a third input that is electrically coupled to the output terminal, the control circuit being configured so that the first control signal is generated so that current through the resistive circuit is less than an adjustable limit value for the current during every point of time of operation;
   wherein the control circuit is configured to generate the first control signal based on a first voltage at the first input and based on a second voltage at the second input; and
   wherein the control circuit comprises a first comparator and a first cell, the first comparator comprising a first input that is electrically connected to the first terminal of the first transistor via the first input of the control circuit and a second input that is electrically connected to the second terminal of the first transistor via the second input of the control circuit;
   wherein the first comparator is configured to compare the first voltage at the first terminal of the transistor to the second voltage at the second terminal of the transistor;
   wherein the first comparator comprises an output that is electrically connected, via the first cell and the first output of the control circuit, to the control terminal of the first transistor, the output of the first comparator for providing a signal corresponding to the first control signal; and
   wherein the first transistor is controllable to be in an active state or an inactive state based on comparison of the first voltage and the second voltage.

2. The circuit of claim 1, wherein the control circuit is configured to output the first control signal so that the first transistor is switched into an active operating state if a value of the first voltage is greater than a value of the second voltage, and the control circuit being configured to output the first control signal so that the first transistor is switched into an inactive operating state if the value of the first voltage is less than the value of the second voltage.

3. The circuit of claim 1, wherein the control circuit is configured to compare the rectified voltage to a pre-set value for the rectified voltage, and to generate the first control signal, the control circuit being configured to output the first control signal so that the first transistor is switched into an inactive operating state instead of an active operating state if a value of the rectified voltage is greater than the pre-set value for the rectified voltage.

4. The circuit of claim 1, wherein the control circuit comprises a fourth input, the control circuit being configured to accept a controlling signal at the fourth input and, based on the controlling signal, to set the first control signal so that the first transistor is in an active operating state or in an inactive operating state.

5. The circuit of claim 4, wherein the control circuit comprises:
   a control cell comprising an output, the control cell being configured to provide a second control signal at the output of the control cell; and
   wherein the first cell comprises a first input electrically coupled to the output of the first comparator, a second input electrically coupled to the output of the control cell, and an output electrically coupled to the first output of the control circuit.

6. The circuit of claim 5, wherein the first cell comprises a switch or a changeover switch, the switch or a changeover switch comprising a control input electrically coupled to the output of the first comparator.

7. The circuit of claim 5, wherein the control cell is configured so that current through the resistive circuit is limited to a value that is less than the adjustable limit value for the current.

8. The circuit of claim 5, further comprising:
   a second transistor comprising a first terminal, a second terminal, and a control terminal, the first terminal of the second transistor being electrically coupled to a further input terminal of the circuit, the second terminal of the second transistor being electrically coupled to the second terminal of the first transistor, and the control terminal of the second transistor being electrically coupled to a second output of the control circuit, wherein the control circuit is configured to provide a third control signal at the second output of the control circuit.

9. The circuit of claim 8, wherein the control circuit comprises:
   a second comparator comprising a first input that is electrically coupled to a fifth input of the control circuit, and a second input that is electrically coupled to the second input of the control circuit; and
   a second cell comprising a first input electrically coupled to an output of the second comparator, and a second input electrically coupled to the output of the control cell, and an output electrically coupled to the second output of the control circuit.

10. The circuit of claim 9, further comprising:
a third transistor comprising a first terminal, a second terminal, and a control terminal, the first terminal of the third transistor being electrically coupled to the input terminal; and
a fourth transistor comprising a first terminal, a second terminal, and a control terminal, the first terminal of the fourth transistor being electrically coupled to the further input terminal and the second terminal of the fourth transistor being electrically coupled to the second terminal of the third transistor.

11. The circuit of claim 10, further comprising a control circuit section, the control circuit section comprising:
a third comparator comprising a first input electrically coupled to the input terminal, and a second input electrically coupled to a reference potential terminal;
a fourth comparator comprising a first input electrically coupled to the further input terminal, and comprising a second input electrically coupled to the second input of the first comparator;
a first logic gate comprising a first input electrically coupled to an output of the first comparator, and comprising an output electrically coupled to the control terminal of the third transistor; and
a second logic gate comprising a first input electrically coupled to an output of the second comparator, a second input electrically coupled to an output of the first logic gate, and an output electrically coupled to the control terminal of the fourth transistor.

12. The circuit of claim 11, further comprising a voltage source for electrically coupling the second input of the third comparator and the reference potential terminal.

13. The circuit of claim 8, further comprising:
a first diode comprising a cathode electrically coupled to the first terminal of the first transistor, and an anode electrically coupled to a reference potential terminal; and
a second diode comprising a cathode electrically coupled to the first terminal of the second transistor, and an anode electrically coupled to the reference potential terminal.

14. The circuit of claim 10, wherein at least one transistor comprises a field-effect transistor.

15. The circuit of claim 14, wherein the field-effect transistor comprises a metal-oxide semiconductor field-effect transistor.

16. The circuit of claim 8, further comprising:
a transformer for electrical coupling to the input terminal, the transformer comprising a secondary terminal for electrical coupling to the further input terminal or to a reference potential terminal.

17. A method for converting an alternating voltage into a rectified voltage comprising:
comparing a value of a first voltage at a first terminal of a first transistor to a value of a second voltage at a second terminal of the first transistor, the first terminal receiving the alternating voltage, and the second terminal being electrically coupled to an output terminal at which the rectified voltage is present;
measuring a current using a resistive circuit comprising a resistor that is between the second terminal of the first transistor and the output terminal; and
setting a first control signal that is supplied to a control terminal of the first transistor so that the first transistor is switched into an active operating state if the value of the first voltage at the first terminal of the first transistor is higher than the value of the second voltage at the second terminal of the first transistor, and so that the first transistor is otherwise in an inactive operating state;
wherein the first control signal is generated so that current flowing through the output terminal is less than an adjustable limit value during every point of time of operation;
wherein comparing is performed by a control circuit comprising a first comparator and a first cell, the first comparator comprising a first input that is electrically connected to the first terminal of the first transistor and a second input that is electrically connected to the second terminal of the first transistor;
wherein the first comparator compares the first voltage at the first terminal of the transistor to the second voltage at the second terminal of the transistor;
wherein the first comparator comprises an output that is electrically connected, via the first cell and a first output of the control circuit, to the control terminal of the first transistor, the output of the first comparator providing a signal corresponding to the first control signal; and
wherein the first transistor is controlled to be in an active state or an inactive state based on comparison of the first voltage and the second voltage.

18. The method of claim 17, further comprising:
comparing the rectified voltage to a preset value for the rectified voltage; and
generating the first control signal so that the first transistor switches to an inactive operating state if the rectified voltage is greater than the preset value for the rectified voltage.

19. The method of claim 17 further comprising:
generating the first control signal when the first transistor is in the active operating state so that an current through the first transistor is less than an adjustable value.

20. The method of claim 19, further comprising:
determining a mean value of a current through the first transistor during N periods of the alternating voltage;
comparing the mean value to an adjustable average value; and
setting the first control signal during a next period so that the first transistor is in the active operating state during an entire half wave if the mean value of the current is below the adjustable value, and so that the first transistor is in the inactive operating state throughout an entire half wave if the mean value of the current is above the adjustable value.

21. The method of claim 17, further comprising:
setting the first control signal so that the first transistor is switched on if a voltage difference between its first terminal and its second terminal is small compared to an amplitude of the alternating voltage.

22. A circuit for converting an alternating voltage into a rectified voltage, comprising:
a first transistor comprising a first terminal, a second terminal, and a control terminal, the first terminal being configured to receive the alternating voltage via an input terminal, the second terminal being electrically coupled to an output terminal for outputting the rectified voltage; and
a control circuit comprising a first input, a second input, and a first output, the first input being electrically coupled to the first terminal of the first transistor, the second input being electrically coupled to the second terminal of the first transistor, and the first output being electrically coupled to the control terminal of the first transistor, the first output for providing a first control signal to the first transistor;

a resistive circuit comprising a series circuit, the series circuit comprising a second transistor and a resistor, the series circuit being electrically coupled in parallel with the first transistor, wherein the first control signal is generated so that current flowing through the output terminal is less than the adjustable limit value for the current;

wherein the control circuit is configured to generate the first control signal based on a first voltage at the first input and based on a second voltage at the second input;

wherein the second transistor comprises a control terminal to receive the first control signal;

wherein the first output of the control circuit is electrically connected to the control terminal of the first transistor;

wherein the control circuit is electrically connected to voltage taps at the resistor in order to determine a voltage drop across the resistor, the voltage drop being usable to determine a current through a parallel circuit comprising the series circuit and the first transistor.

23. A method for converting an alternating voltage into a rectified voltage comprising:

comparing a value of a first voltage at a first terminal of a first transistor to a value of a second voltage at a second terminal of the first transistor, the first terminal receiving the alternating voltage, and the second terminal being electrically coupled to an output terminal at which the rectified voltage is present;

measuring a current using a resistive circuit comprising a series circuit comprising a second transistor and a resistor, the series circuit comprising an input side and an output side and being electrically coupled, at via the input side and the output side, in parallel with the first transistor; and setting a first control signal that is supplied to a control terminal of the first transistor so that the first transistor is switched into an active operating state if the value of the first voltage at the first terminal of the first transistor is higher than the value of the second voltage at the second terminal of the first transistor, and so that the first transistor is otherwise in an inactive operating state;

wherein the first control signal is generated so that a current flowing through the output terminal is less than an adjustable limit value;

wherein a control circuit generates the first control signal based on the first voltage and the second voltage;

wherein the second transistor comprises a control terminal to receive the first control signal; and wherein the control circuit is connected to voltage taps at the resistor in order to determine a voltage drop across the resistor, the voltage drop being used to determine a current through a parallel circuit comprising the series circuit and the first transistor.

* * * * *

UNITED STATES PATENT AND TRADEMARK OFFICE
CERTIFICATE OF CORRECTION

| | | |
|---|---|---|
| PATENT NO. | : 8,134,847 B2 | Page 1 of 1 |
| APPLICATION NO. | : 11/995881 | |
| DATED | : March 13, 2012 | |
| INVENTOR(S) | : Peter Trattler | |

It is certified that error appears in the above-identified patent and that said Letters Patent is hereby corrected as shown below:

Title Page, item (73), Assignee, Column 1, Line 7 – delete "DE" and insert -- AT --, therefor.

Signed and Sealed this
Eighteenth Day of September, 2012

David J. Kappos
*Director of the United States Patent and Trademark Office*